United States Patent [19]

Bice

[11] Patent Number: 5,796,262

[45] Date of Patent: Aug. 18, 1998

[54] METHOD AND APPARATUS FOR DIAGNOSING BEARING INSULATION IMPEDANCE OF A ROTATING ELECTRICAL APPARATUS

[75] Inventor: Charles D. Bice, Clinton Township, Pa.

[73] Assignee: Westinghouse Electric Corporation, Pittsburgh, Pa.

[21] Appl. No.: 601,260

[22] Filed: Feb. 14, 1996

[51] Int. Cl.$^6$ .................................................. G01R 27/08
[52] U.S. Cl. ........................... 324/714; 340/515; 376/245
[58] Field of Search .......................... 324/714; 73/866.5; 340/256; 318/434

[56] References Cited

U.S. PATENT DOCUMENTS

| | | | |
|---|---|---|---|
| 3,831,160 | 8/1974 | Cronin et al. | 340/256 |
| 4,413,474 | 11/1983 | Moscrip | 60/517 |
| 4,523,451 | 6/1985 | Boster | 73/37.6 |
| 4,564,500 | 1/1986 | Keady | 376/463 |
| 4,709,339 | 11/1987 | Fernandes | 364/492 |
| 4,737,775 | 4/1988 | Tokuda et al. | 340/647 |
| 4,896,101 | 1/1990 | Cobb | 324/73.1 |
| 5,006,769 | 4/1991 | Posedel | 318/434 |
| 5,038,893 | 8/1991 | Willner et al. | 184/7.4 |
| 5,107,447 | 4/1992 | Ozawa et al. | 364/551.01 |
| 5,287,875 | 2/1994 | Otani | 137/15 |
| 5,329,465 | 7/1994 | Arcella et al. | 364/551.01 |
| 5,485,491 | 1/1996 | Salnick et al. | 376/245 |
| 5,520,061 | 5/1996 | Thibault et al. | 73/866.5 |

OTHER PUBLICATIONS

Robert L. Osborne et al., On–line Diagnosis of Instrumentation Through Artificial Intelligence, pp. 1–6, Oct. 1985, EPRI.

I. J. King, Dr. et al., Turbine Generator On–Line Diagnostic System, pp. 1–6, Oct. 1987, ASME/IEEE.

M. A. Moradian et al., Generator Artificial Intelligence Diagnostics On–Line Experience, pp. 1–19, 1990, EPRI.

Robert L. Osborne et al., On–Line Diagnostics and Monitors for the 1990s, pp. 29–36, 1991, PWR—vol. 13, Design, Repair, and Refurbishment of Steam Turbines.

Robert F. Gray et al., User Interface Graphically Improves Generator AI Diagnostics, pp. 16–20, Jul. 1991, IEEE Computer Applications in Power.

The White House—Office of the Press Secretary, Technology Reinvestment Project, p. 3, Oct. 22, 1993.

Primary Examiner—Sandra L. O'Shea
Assistant Examiner—Thomas Valone

[57] ABSTRACT

A system diagnoses the operability of a rotating electrical apparatus such as a reactor coolant pump (RCP) motor. The RCP motor includes a rotatable shaft, a stator, a bearing assembly and a bearing insulator. The bearing assembly electrically contacts the rotatable shaft and the bearing insulator at least partially electrically insulates the rotatable shaft and the bearing assembly from the stator. The system includes a shaft transformer and voltage source for inducing a voltage in the rotatable shaft; a variable resistor in parallel with the bearing insulator having first and second resistances; an analog-to-digital converter for sensing a first voltage associated with the first resistance and a second voltage associated with the second resistance; and means for determining the operability or the impedance of the bearing insulator from the first and second voltages and the second resistance.

20 Claims, 9 Drawing Sheets

5,796,262

METHOD AND APPARATUS FOR DIAGNOSING BEARING INSULATION IMPEDANCE OF A ROTATING ELECTRICAL APPARATUS

BACKGROUND OF THE INVENTION

1. Field of the Invention

This invention is directed to an apparatus for diagnosing the operability of a rotating electrical apparatus and, more particularly, to an apparatus for diagnosing bearing insulation impedance of a rotating electrical apparatus such as a motor. The invention is also directed to a method for diagnosing the operability of a rotating electrical apparatus and, more particularly, to a method for determining bearing insulation impedance of a rotating electrical apparatus such as a motor.

2. Background Information

Reactor coolant pump (RCP) motors include a shaft rotatably supported in a frame or housing by an upper bearing assembly and a lower bearing assembly. During operation of the RCP motor, a shaft voltage may be generated which has the potential of causing arc discharges across the oil film of the bearings in the upper and lower bearing assemblies. Such discharges may cause physical damage to the surfaces of the bearings and accelerated oxidative aging of the oil as a result of direct oxidation and the introduction of catalyst materials.

The RCP motor employs bearing insulators associated with the upper and lower bearing assemblies to electrically insulate the shaft from the motor frame which is typically connected to ground. Under normal operation of the RCP motor, the impedance of these insulators effectively limits any current in the shaft and through the bearings induced by the shaft voltage.

Typically, the lower guide bearing of the lower bearing assembly is effectively shunted by the relatively low impedance (e.g., less than about 3Ω) of the seals and bearing of the RCP powered by the RCP motor. Hence, the lower guide bearing is generally not exposed to the effect of the shaft voltage. In this case, the full shaft potential is imposed across the upper bearing assembly. To protect the upper bearing assembly from arc discharge damage, insulation is provided between the stator and the upper bearing assembly at an upper motor bracket or oil reservoir associated with the upper bearing assembly. Depending on the manufacturer of the RCP motor, the impedance of the upper bearing insulation may range from about several hundred ohms to about several thousand ohms or greater.

The RCP seals and bearing between the RCP motor and the RCP, the lower bearing assembly, and the upper bearing assembly of the RCP motor form three parallel current paths between the shaft and the stator of the RCP motor. Therefore, a determination of the insulation integrity is impaired by the relatively low impedance of the RCP. Under conventional practice using a conventional ohm meter, the appropriate determination of the impedance of the upper bearing insulation of an idle RCP motor can only be made if: (1) the RCP motor is uncoupled from the RCP; and (2) the lower guide bearing is provided with a high impedance insulation system or, alternatively, is disassembled from the RCP motor.

Significant time and field effort are required to disassemble RCP motors and perform the requisite insulation inspections. Furthermore, where the RCP motor is located within a nuclear containment vessel, unnecessary human exposure to radiation would result.

It is known to utilize a shaft transformer to passively measure current flowing in the shaft of an RCP motor. The shaft transformer employs an inductive coupling between the shaft, which forms a primary winding, and the secondary winding of the shaft transformer to measure the shaft current.

It is further known to utilize the measured shaft current, as sensed by the shaft transformer, to determine the integrity of the bearing insulators of the RCP motor.

Under certain conditions, the impedance of each of the oil films between the upper and lower bearing assemblies and the shaft limits the electromagnetically induced current in the shaft. In this case, the measured shaft current does not provide a suitable measure of the bearing insulation integrity. Under other conditions involving faulty bearings, variations in the impedance of the bearing oil films cause corresponding variations in the measured shaft current. Accordingly, the measured shaft current does not always provide a reliable measure of bearing insulation integrity.

Furthermore, although the shaft transformer normally senses the inductively coupled shaft current, such transformer further senses the amplitude of capacitively coupled voltages within the motor. The internal voltages of an RCP motor, for example, may be about 4000 volts or higher in the motor stator windings. If these internal voltages are capacitively coupled to the shaft transformer, the sensed capacitively coupled motor voltage may predominate over the sensed inductively coupled shaft current. The sensed capacitively coupled motor voltage further predominates whenever the number of turns (e.g., N which is typically much greater than one) of the secondary winding exceeds the number of turns (i.e., one provided by the shaft) of the primary winding of the shaft transformer. In this case, for a transformer having some loss, the actual shaft current is greater than the sensed inductively coupled current by greater than a factor of N:1. Accordingly, measurement of the actual shaft current may be further impaired.

There is a need, therefore, for a method and apparatus which accurately diagnose the bearing insulation impedance of a rotating electrical apparatus.

There is a more particular need for such a method and apparatus which accurately diagnose the bearing insulation impedance of an operational rotating electrical apparatus.

SUMMARY OF THE INVENTION

These and other needs are satisfied by the invention which is directed to a system for diagnosing operability of a rotating electrical apparatus including a rotatable shaft, a stator, a bearing and an insulator, with the bearing electrically contacting the rotatable shaft and the insulator at least partially electrically insulating the rotatable shaft and the bearing from the stator. The system includes means for inducing an electrical signal in the rotatable shaft; variable impedance means in parallel with the insulator having a first impedance and a second impedance; means for sensing a first electrical parameter associated with the first impedance and a second electrical parameter associated with the second impedance; and means for determining the operability of the insulator from the first and second electrical parameters and the second impedance.

As another aspect of the invention, a system diagnoses operability of a rotating electrical apparatus including a rotatable shaft, a stator, a first bearing, a second bearing, a first insulator and a second insulator, with the first and second bearings electrically contacting the rotatable shaft, and with each of the first and second insulators at least partially electrically insulating the rotatable shaft and a corresponding one of the first and second bearings from the stator. The system includes means for inducing an electrical signal in the rotatable shaft; variable impedance means in parallel with one of the insulators having a first impedance and a second impedance; means for sensing a first electrical parameter associated with the first impedance and a second electrical parameter associated with the second impedance; and means for determining the operability of at least one of the insulators from the first and second electrical parameters and the second impedance.

As a further aspect of the invention, a system diagnoses operability of a rotating electrical apparatus including a rotatable shaft, a stator, a bearing and an insulator having an impedance, with the bearing electrically contacting the rotatable shaft and the insulator at least partially electrically insulating the rotatable shaft and the bearing from the stator. The system includes means for inducing an electrical signal in the rotatable shaft; variable impedance means in parallel with the insulator having a first impedance and a second impedance; means for sensing a first electrical parameter associated with the first impedance and a second electrical parameter associated with the second impedance; and means for determining the impedance of the insulator from the first and second electrical parameters and the second impedance.

As a still further aspect of the invention, a method diagnoses the operability of a rotating electrical apparatus including a rotatable shaft, a stator, a bearing and an insulator having an impedance, with the bearing electrically contacting the rotatable shaft and the insulator at least partially electrically insulating the rotatable shaft and the bearing from the stator. The method includes the steps of inducing an electrical signal in the rotatable shaft; employing a first impedance in parallel with the insulator; sensing a first electrical parameter associated with the first impedance; employing a second impedance in parallel with the insulator; sensing a second electrical parameter associated with the second impedance; and determining the impedance of the insulator from the first and second electrical parameters and the second impedance.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
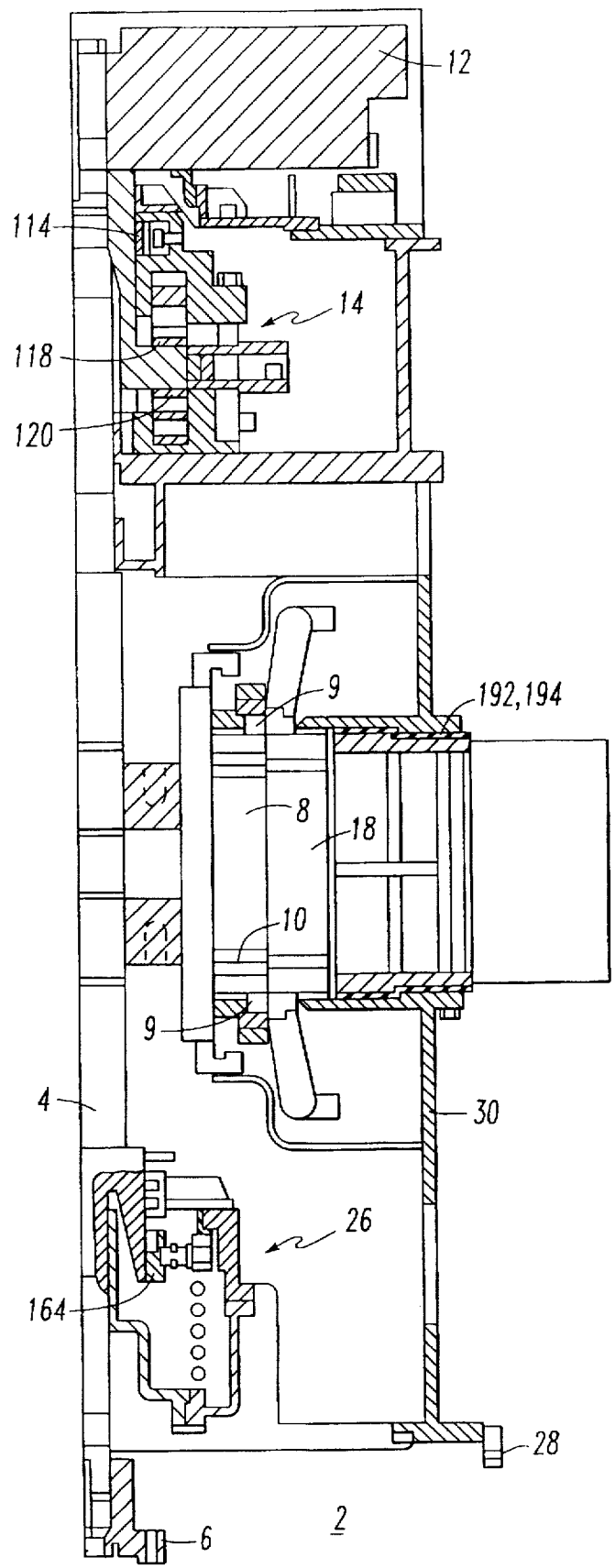
FIG. 1 is a vertical sectional view of a right half of a reactor coolant pump (RCP) motor.

FIG. 1 illustrates a conventional reactor coolant pump (RCP) motor 2 to which the invention is applied, although the invention is applicable to a wide range of rotating electrical apparatus (e.g., a motor, a motor and pump, or a generator). The exemplary RCP motor 2 is disclosed in U.S. Pat. No. 5,485,491 which is incorporated by reference herein. For convenience of reference, the reference numerals up to and including 194 employed herein are consistent with U.S. Pat. No. 5,485,491.

Figure 2:
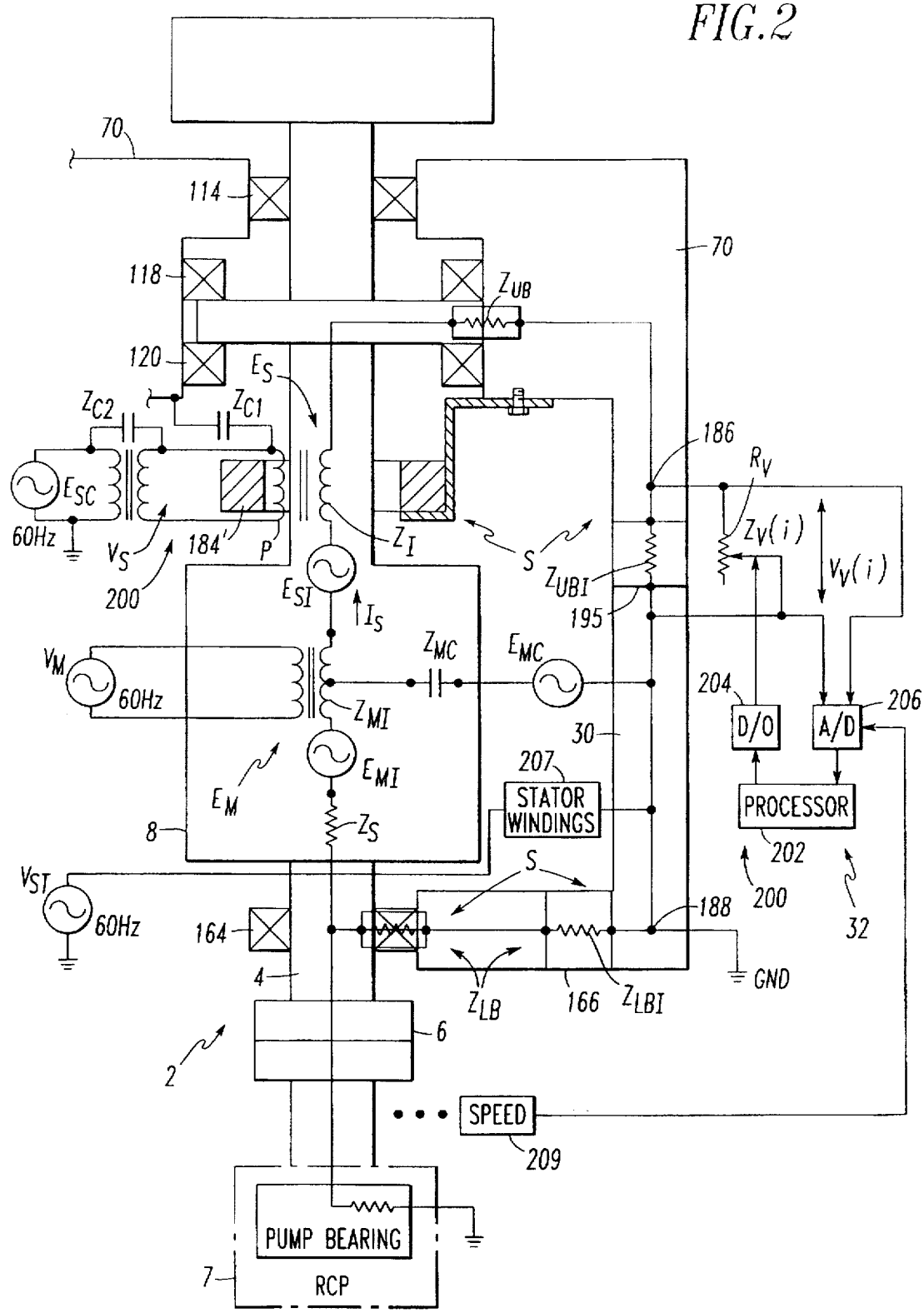
FIG. 2 is an electrical block diagram of a motor and a system including a shaft transformer for diagnosing the motor in accordance with the invention.

The RCP motor 2 includes a central rotatable shaft 4 having a drive shaft coupling 6 at one end of the shaft 4 for connection to a RCP 7 (shown in FIG. 2). The RCP motor 2 also includes a rotor 8 having rotor conductors 9 and a rotor core 10; a flywheel 12; an upper bearing assembly 14 having bearings 114,118,120; a stator 18; and a lower radial bearing assembly 26 having lower guide bearing 164, all contained in a frame or housing 30 having a motor mounting flange 28.

FIG. 2 illustrates an equivalent electrical circuit of the major mechanical members of the RCP 7 and RCP motor 2 which typically influence the circulation of current related to induced voltages in the shaft 4. The RCP motor 2 further includes a plurality of upper bearing insulators, which are shown by the single upper bearing insulator 195, and a lower bearing insulator 166. The insulator 195 insulates an upper oil reservoir 70 from the frame 30 (and the stator 18 of FIG. 1) which is connected to ground GND. The insulator 166 insulates the lower bearing 164 from the frame 30 and ground GND. The bearings 114,118,120 and 164 respectively electrically contact upper and lower portions of the rotatable shaft 4. The insulators 195 and 166 electrically insulate the bearings 114,118,120 and 164, respectively, and the rotatable shaft 4 from the frame 30 (and the stator 18). The housing 30 partially encloses the shaft 4 which extends from the housing 30 and engages the RCP 7 at the coupling 6.

Continuing to refer to FIG. 2, a shaft transformer 184' (shown in vertical sectional view in FIG. 2) is around the rotatable shaft 4 of the RCP motor 2. Around and about the transformer 184' is a plural-turn primary winding P. A single-turn secondary winding S of the transformer 184' is formed by the rotatable shaft 4; the upper oil reservoir 70 and upper bearings 114,118,120 (i.e., the upper bearing assembly 14 of FIG. 1); the upper bearing insulator 195; the frame 30; the lower bearing insulator 166; and the lower bearing 164 (i.e., the lower bearing assembly 26 of FIG. 1). Connected to the primary winding P is an exemplary 60 Hz alternating current (AC) voltage source $V_S$. The voltage source $V_S$ sources current to the primary winding P which, in turn, induces an electrical signal including an AC voltage ($E_S$) and an AC current ($I_S$) in the shaft 4 and frame 30 of the motor 2.

As discussed in greater detail below in connection with FIGS. 7–10, under various operating conditions, part of the induced AC voltage $E_S$ appears across the upper bearing insulator 195. The impedance ($Z_{UBI}$) of the upper bearing insulator 195 is determined by placing a variable impedance, such as the impedance of the exemplary variable shunt resistor $R_V$, in parallel with the insulator 195, although the invention is applicable to any variable impedance (e.g., a potentiometer, a resistor network, or a resistor decade box). In turn, plural voltage values ($V_V(i)$) corresponding to various impedances ($Z_V(i)$) of the shunt resistor $R_V$ permit the calculation of the upper bearing insulator impedance $Z_{UBI}$. An important aspect of the invention permits the determination of the upper bearing insulator impedance $Z_{UBI}$ without the need for uncoupling the RCP motor 2 from the RCP 7, and without concern for the impedance ($Z_{LB}$, which includes the impedance ($Z_{LBI}$) of the lower bearing insulator 166) of the lower bearing assembly 26 of FIG. 1.

Figure 7:
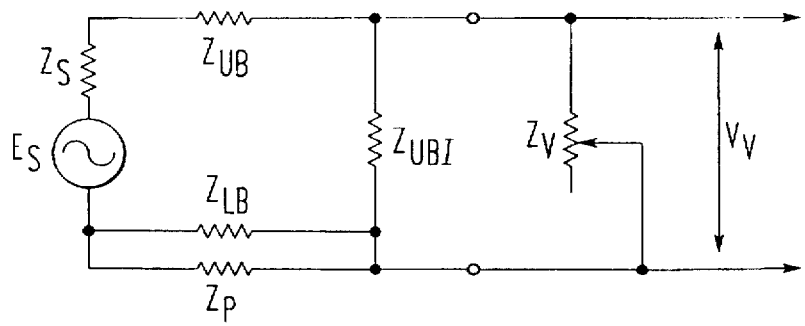
FIG. 7 is an equivalent circuit diagram of the motor and pump of FIG. 6.

FIG. 7 illustrates an equivalent circuit diagram of the RCP motor 2 and RCP 7 engaged by the rotatable shaft 4 of FIGS. 1 and 2. During operation of the RCP motor 2, lower bearing 164 is protected from circulating currents by the extremely low impedance ($Z_P$) of the seals and pump bearing (PUMP BEARING) of RCP 7 which substantially electrically short circuits the bearing 164 and insulator 166. On the other hand, the upper bearings 114,118,120 are not so protected by the RCP 7. Under normal operation of the RCP motor 2, the insulator 195 effectively prevents the passage of significant electric current from the shaft 4 (having shaft impedance $Z_S$) through the bearings 114,118,120 (having upper bearing impedance $Z_{UB}$).

Figure 6:
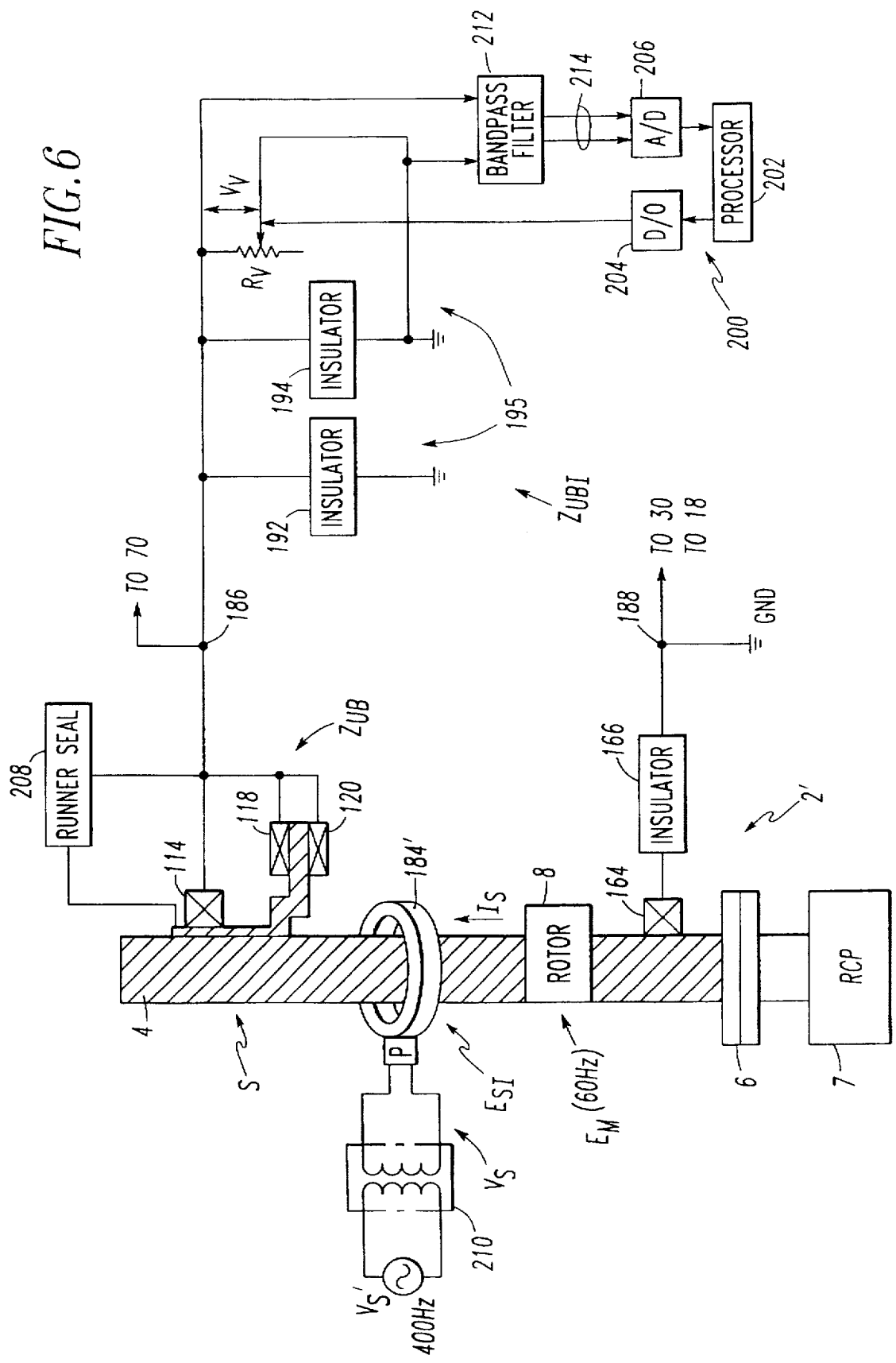
FIG. 6 is a block diagram of a motor and pump, and a system for diagnosing the motor in accordance with another alternative embodiment of the invention.

Referring again to FIG. 2, the shaft transformer 184' is powered at an exemplary 60 Hz or, alternatively at any different frequency (e.g., 400 Hz as shown in FIG. 6), to induce the AC voltage $E_S$ in the shaft 4. The shaft transformer 184' couples to the shaft 4 both capacitively (as a conventional actively driven voltage transformer) and inductively (as a conventional actively driven current transformer). With respect to the upper bearing insulator 195, the capacitive coupling of the shaft transformer 184' is induced from the voltage source $E_{SC}$ through stray impedance $Z_{C1}$ in series with stray impedance $Z_{C2}$ to the upper oil reservoir 70. Conversely, the inductive coupling of the shaft transformer 184' appears as a voltage ($E_{SI}$) with a relatively low internal impedance ($Z_I$). Typically, the capacitive coupling provides a higher amplitude voltage to the shaft 4 than the inductive coupling.

A system 200 for diagnosing the operability of the RCP motor 2 includes the shaft transformer 184', a power source such as the voltage source $V_S$, the variable shunt resistor $R_V$, and a processor 202, although the invention is applicable to any analog and/or digital circuit and/or processor suitable for determining an impedance from electrical parameters and another impedance. The voltage source $V_S$ induces an electrical signal, such as the voltage $E_S$, in the rotatable shaft 4 through the primary P of the transformer 184'. The variable shunt resistor $R_V$, in parallel with the insulator 195, has a plurality of impedances ($Z_V(i)$) which are selected by a digital output (D/O) module 204 of the processor 202. The processor 202 senses the voltage values ($V_V(i)$) corresponding to the selected impedances ($Z_V(i)$) of the shunt resistor $R_V$ through an analog-to-digital (A/D) converter module 206. As explained in greater detail below in connection with FIGS. 6–12, the processor 202 determine the operability of a bearing insulator, such as the insulator 195, from the voltage values ($V_V(i)$) and at least one of the corresponding selected impedances ($Z_V(i)$).

Continuing to refer to FIG. 2, the motor induced shaft voltage $E_M$ of the exemplary RCP motor 2 is provided, in part, by an exemplary 60 Hz AC voltage $V_M$. The voltage $V_M$ is induced from a portion of the stator voltage source $V_{ST}$ as a result of uneven rotor flux provided by stator windings 207. The frequency of the voltage $V_M$ is typically about equal to the frequency of the voltage source $V_S$, although different frequencies are possible (see, e.g., FIG. 6).

Figure 8:
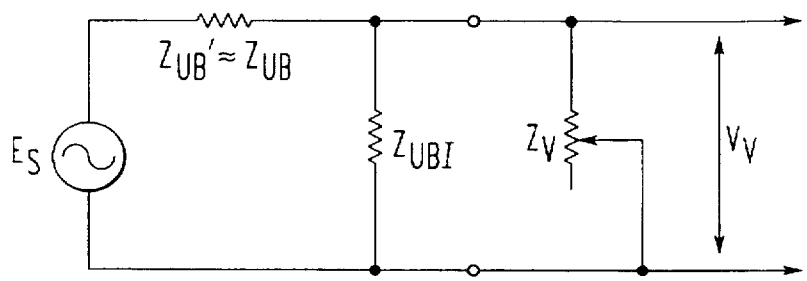
FIG. 8 is a simplified equivalent circuit diagram of FIG. 7.

With the dual capacitive and inductive coupling of the shaft transformer 4, determinations of the impedance of the upper bearing insulator 195 may be made in either of the coupled or uncoupled states of the RCP motor 2. Referring to FIG. 8, which is a simplified equivalent circuit diagram of FIG. 7, if the RCP motor 2 is coupled to the RCP 7, then the relatively low impedance ($Z_P$) of the RCP 7 will effectively short circuit the portion of the voltage $E_{SC}$ which is coupled by the impedances $Z_{C2}, Z_{C1}$ from the voltage source $E_{SC}$ to the upper oil reservoir 70, through the upper bearings 114,118,120, and to the shaft 4. However, part of the voltage of the inductively coupled voltage $E_{SI}$ (i.e., the shaft voltage $E_S$) will still be present across the upper bearing insulator 195. As explained below in connection with FIGS. 8–9, such voltage is employed with various shunt impedance combinations ($Z_V(i)$) to determine the impedance $Z_{UBI}$ of the upper bearing insulator 195.

As shown in FIG. 8, all circuit impedances, except the upper bearing insulator impedance $Z_{UBI}$, may be lumped and assigned with the upper bearing assembly impedance $Z_{UB}$ to impedance $Z_{UB}'$ which is defined by Equation 1.

$$Z_{UB}' = Z_{UB} + Z_S + \frac{Z_P \times Z_{LB}}{Z_P + Z_{LB}} \qquad \text{Eq. (1)}$$

Normally, the shaft impedance $Z_S$ and the pump impedance $Z_P$ are relatively small (e.g., less than about 3 106 ) in comparison with the upper bearing insulator impedance $Z_{UBI}$ and the upper bearing assembly impedance $Z_{UB}$ (both of which are typically greater than about several hundred ohms and often exceed about several thousand ohms). In this case, the impedance $Z_{UB}'$ is approximately equal to the upper bearing assembly impedance $Z_{UB}$ as shown in Equation 2.

$$Z_{UB}' \approx Z_{UB} \qquad \text{Eq. (2)}$$

Figure 9:
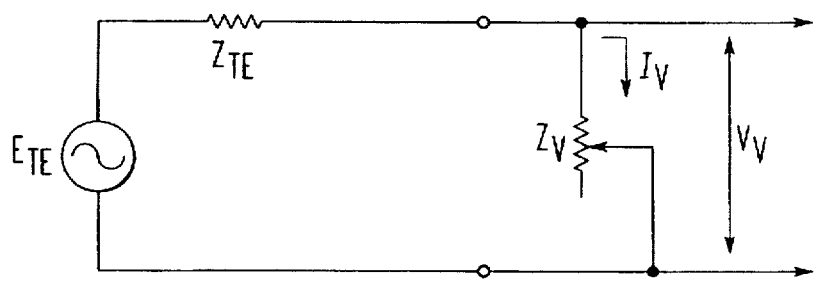
FIG. 9 is a Thévenin equivalent circuit diagram of FIG. 8.

FIG. 9 is the Thévenin equivalent of FIG. 8. The Thévenin equivalent impedance $Z_{TE}$ of FIG. 9 is defined by Equation 3.

$$Z_{TE} = \frac{Z_{UBI} \times Z_{UB}}{Z_{UBI} + Z_{UB}} \qquad \text{Eq. (3)}$$

The Thévenin equivalent voltage $E_{TE}$ of FIG. 9 is determined from Equation 4.

$$E_{TE} = \frac{E_S \times Z_{UBI}}{Z_{UB} + Z_{UBI}} = V_{VO} \qquad \text{Eq. (4)}$$

where:

$Z_V$=open circuit (e.g., about $\infty$ $\Omega$); and $V_{VO}=V_V$ with $Z_V$ open circuited.

The value of the Thévenin equivalent impedance $Z_{TE}$ is determined from Equations 5 and 6.

$$I_V(i) = \frac{V_V(i)}{Z_V(i)} \qquad \text{Eq. (5)}$$

$$Z_{TE}(i) = \frac{E_{TE} - V_V(i)}{I_V(i)} = \frac{V_{VO} Z_V(i)}{V_V(i)} - Z_V(i) \qquad \text{Eq. (6)}$$

where:

$Z_V(i)$=selected value of the impedance $Z_V$;

$V_V(i)$=measured voltage across the selected impedance $Z_V(i)$;

$V_V(i) < V_{VO}$;

$I_V(i)$=current through the selected impedance $Z_V(i)$; and
$Z_{TE}(i)$=calculated value of the Thévenin impedance $Z_{TE}$ for the selected impedance $Z_V(i)$.

With one measurement of $V_{VO}$, the Thévenin equivalent voltage $E_{TE}$ is determined from Equation 4. Subsequently, with a second measurement of $V_V(i)$ at a selected impedance $Z_V(i)$, the value of the Thévenin impedance $Z_{TE}(i)$ for the selected impedance $Z_V(i)$ is determined from Equation 6. Those skilled in the art will appreciate that equivalent measurements of $I_V(i)$ will provide the corresponding value of $V_V(i)$ from Equation 5.

By averaging, as shown in Equation 7, the value of plural Thévenin equivalent impedances $Z_{TE}(i)$, which are calculated at various selected values of the impedance $Z_V(i)$ for corresponding measured voltages $V_V(i)$ thereacross, a more precise value of the Thévenin equivalent impedance $Z_{TE}$ may be determined.

$$Z_{TE} = \frac{\Sigma(Z_{TE}(i))}{N} \qquad \text{Eq. (7)}$$

where:

N=number of measurements with $V_V(i) < V_{VO}$.

If the upper bearing assembly impedance $Z_{UB}$ is known, the value of the upper bearing insulator impedance $Z_{UBI}$ is determined from Equation 8. Those skilled in the art will appreciate that a Norton equivalent circuit may be employed in place of the Thévenin equivalent circuit of FIG. 9 to determine the upper bearing insulator impedance $Z_{UBI}$.

$$Z_{UBI} = \frac{Z_{TE} \times Z_{UB}}{Z_{UB} - Z_{TE}} \qquad \text{Eq. (8)}$$

Otherwise, if the upper bearing assembly impedance $Z_{UB}$ is not precisely known, the value of the Thévenin impedance $Z_{TE}(i)$ from Equations 6 or 7 may be used as a worst case surrogate value of the upper bearing insulator impedance $Z_{UBI}$. For example, if the value of the upper bearing assembly impedance $Z_{UB}$ is infinite, the value of the Thévenin impedance $Z_{TE}(i)$ is equal to the value of the upper bearing insulator impedance $Z_{UBI}$. Otherwise, if the value of the upper bearing assembly impedance $Z_{UB}$ is positive but finite, then the value of the Thévenin impedance $Z_{TE}(i)$ is less than the value of the upper bearing insulator impedance $Z_{UBI}$ and, hence, provides a conservative measure of the impedance $Z_{UBI}$.

Figure 10:
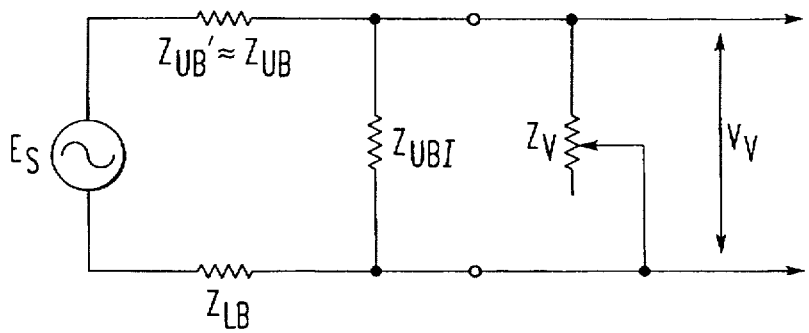
FIG. 10 is an equivalent circuit diagram of the motor of FIG. 2.

On the other hand, if the RCP motor 2 is uncoupled from the RCP 7 and the motor 2 is not running (as shown in FIG. 10 by the equivalent schematic of the RCP motor 2 of FIG. 2), then the relatively high amplitude voltage typical of capacitive coupling from the voltage source $E_{SC}$ is substantially coupled from the upper oil reservoir 70, through the upper bearings 114,118,120, and to the shaft 4. In this case, a shorting lead (not shown) may be placed across the insulator 166 and the lower bearing 164 to eliminate the capacitively coupled voltage, and upper bearing insulation determinations may be made by use of the inductively coupled voltage as discussed above for the case of the motor 2 being coupled to the RCP 7. Conversely, a shorting lead (not shown) may be placed across the insulator 195 and the upper bearings 114,118,120 to eliminate the capacitively coupled voltage, and lower bearing insulation determinations may be made by use of the inductively coupled voltage in a manner similar to the discussion above in connection with FIG. 2, except that a variable shunt resistor $R_{VL}$ (not shown) is placed in parallel with the lower bearing insulator 166.

As shown in FIG. 10, the inductively coupled shaft voltage $E_{SI}$ of FIG. 2 induces the shaft voltage $E_S$ which is employed with various shunt impedance combinations ($Z_V$(i)). The resultant voltages $V_V(i)$ are employed to determine the Thévenin equivalent impedance ($Z_{TELB}$) for the combination of: (1) the impedance ($Z_{LB}$) of the lower bearing 164 and insulator 166; (2) the upper bearing assembly impedance $Z_{UB}$; and (3) the upper bearing insulator impedance $Z_{UBI}$. The Thévenin equivalent impedance $Z_{TELB}$ is defined by Equation 9.

$$Z_{TELB} = \frac{Z_{UBI} \times (Z_{UB} + Z_{LB})}{Z_{UBI} + Z_{UB} + Z_{LB}} \qquad \text{Eq. (9)}$$

The Thévenin equivalent voltage $E_{TELB}$ associated with the Thévenin equivalent impedance $Z_{TELB}$ is determined from Equation 10.

$$E_{TELB} = \frac{E_S \times Z_{UBI}}{Z_{UBI} + Z_{UB} + Z_{LB}} = V_{VO} \qquad \text{Eq. (10)}$$

The value of the Thévenin equivalent impedance $Z_{TELB}$ is determined from Equation 11 in a similar manner as discussed above in connection with Equation 6. When the RCP motor 2 is uncoupled from the RCP 7, the value of the Thévenin impedance $Z_{TELB}$ from Equation 11 is useful in diagnosing the impedance of the combination of impedances including the lower bearing and insulator impedance $Z_{LB}$, the upper bearing assembly impedance $Z_{UB}$, and the upper bearing insulator impedance $Z_{UBI}$.

$$Z_{TELB}(i) = \frac{E_{TE} - V_V(i)}{I_V(i)} = \frac{V_{VO} Z_V(i)}{V_V(i)} - Z_V(i) \qquad \text{Eq. (11)}$$

Referring again to FIG. 2, under normal operation of the RCP motor 2 and RCP 7, "pump coast-down" of the RCP 7 provides a unique opportunity to employ the inductively coupled voltage $E_{SI}$ of the shaft transformer 184'. During such coast-down, the motor shaft voltage $E_M$ of the motor 2 (from the capacitively coupled voltage $E_{MC}$ and the inductively coupled voltage $E_{MI}$) is zero. In this case, a measurable part of the low amplitude inductively coupled voltage $E_{SI}$ of the shaft transformer 184' is across the upper bearing insulator 195. As the speed of the motor 2 decreases, the thickness of the oil film (not shown) at the bearings 114, 118,120 decreases which decreases the upper bearing assembly impedance $Z_{UB}$. The value of the Thévenin impedance $Z_{TE}$ from Equation 6, which includes the upper bearing assembly impedance $Z_{UB}$ and the upper bearing insulator impedance $Z_{UBI}$, may be determined as discussed above in connection with FIGS. 8–9.

If the upper bearing insulator impedance $Z_{UBI}$ is known, the value of the upper bearing assembly impedance $Z_{UB}$ is determined from Equation 12. A relative change in oil film thickness, which corresponds to the change ($\Delta Z_{UB}$) in the upper bearing assembly impedance $Z_{UB}$, may be determined from Equation 13.

$$Z_{UB}(i) = \frac{Z_{TE}(i) \times Z_{UBI}}{Z_{UBI} - Z_{TE}(i)} \qquad \text{Eq. (12)}$$

$$\Delta Z_{UB} = Z_{UB}(i) - Z_{UBO} \qquad \text{Eq. (13)}$$

where:

$Z_{UBO}$=upper bearing assembly impedance reference value; and $Z_{TE}(i)$=current value of Thévenin equivalent impedance from Equation 6.

Otherwise, if the upper bearing insulator impedance $Z_{UBI}$ is not precisely known, the value of the Thévenin impedance $E_{TE}(i)$ from Equation 6 may be used as a worst case surrogate value of the upper bearing assembly impedance $Z_{UB}$. For example, if the value of the upper bearing insulator impedance $Z_{UBI}$ is infinite, the value of the Thévenin impedance $Z_{TE}(i)$ is equal to the value of the upper bearing assembly impedance $Z_{UB}$. Otherwise, if the value of the upper bearing insulator impedance $Z_{UBI}$ is positive and finite, then the value of the Thévenin impedance $Z_{TE}(i)$ is less than the value of the upper bearing assembly impedance $Z_{UBI}$ and, hence, provides a conservative measure of the impedance $Z_{UB}$.

Continuing to refer to FIG. 2, the shaft transformer 184' is actively powered with an exemplary primary voltage of about 12 VAC at a frequency of about 60 Hz, although the invention is applicable to a wide range of primary voltage and frequency combinations. During operation of the RCP motor 2, the rotor 8 rotates under the influence of circulating flux fields associated with the stator voltage source $V_{ST}$. In turn, the rotor 8 rotates the shaft 4. When the shaft transformer 184' is actively powered during operation of the RCP motor 2, the exemplary 60 Hz motor shaft voltage $E_M$, which is induced by the 60 Hz electromagnetic field of the motor 2, overwhelms the much smaller inductively coupled voltage $E_{SI}$ of the shaft transformer 184'. The shaft voltage $E_S$, part of which is measurable at the insulator 195, is primarily determined by the motor shaft voltage $E_M$ which is induced by the voltage $V_M$.

In the case where the RCP motor 2 has a relatively high upper bearing assembly impedance $Z_{UB}$, the upper bearing insulator impedance $Z_{UBI}$ may be determined during operation of the RCP motor 2, as discussed above in connection with FIGS. 8-9. However, if the RCP motor 2 has a relatively low upper bearing assembly impedance $Z_{UB}$, then the Thévenin equivalent impedance $Z_{TE}$ is also relatively low (see, e.g., Equation 3). In this case, the variable nature of the motor shaft voltage $E_M$ induced by the voltage $V_M$ and the low impedance Thévenin equivalent voltage source $E_{TE}$ for the upper bearing insulator 195 produce less favorable results than discussed above in connection with FIGS. 8-9. As discussed below in connection with FIG. 6, another technique is better suited for determining the upper bearing insulator impedance $Z_{UBI}$ during operation of the RCP motor 2.

As shown in FIG. 6, an RCP motor 2' has a mechanical seal, such as the exemplary runner seal 208, which has a relatively low impedance path (e.g., about 1 Ω) in parallel with the impedance of the oil film (not shown) of the upper bearings 114,118,120. In this case, the upper bearing impedance $Z_{UB}$, which includes the parallel combination of the impedance of the bearings 114,118,120 and the impedance of the runner seal 208, is substantially smaller than the upper bearing insulator impedance $Z_{UBI}$. The insulators 192,194 insulate the upper oil reservoir 70 (shown in FIG. 2) at node 186 from the stator 18 (shown in FIG. 1) and the frame 30 (shown in FIGS. 1-2) at node 188 (GND). The insulators 192,194 form the equivalent upper bearing insulator 195 (shown in FIG. 2) which is connected in parallel between nodes 186 and 188. The lower bearing insulator 166 insulates the lower bearing 164 from the node 188.

A power source, such as the voltage source $V_S'$, drives a step-down transformer 210 which provides about 12 VAC at a frequency of about 400 Hz to the primary winding P of the shaft transformer 184', although the invention is applicable to a wide range of primary voltage and frequency combinations. A corresponding filter, such as the exemplary 400 Hz bandpass filter 212, facilitates sensing part of the voltage of the inductively coupled voltage $E_{SI}$ at the upper bearing insulator 195 while the RCP motor 2' is energized. An important aspect of this embodiment of the invention is that the voltage source $V_S'$ provides a suitably constant AC shaft voltage $E_{SI}$, in contrast with the variable AC motor shaft voltage $E_M$ of the RCP motor 2'.

The exemplary 400 Hz bandpass filter 212 substantially removes the exemplary 60 Hz frequency of the motor shaft voltage EM and passes the exemplary 400 Hz frequency of the inductively coupled voltage $E_{SI}$. The variable resistor $R_V$ has the voltage $V_V$ with the 60 and 400 Hz frequencies thereacross. The filter 212, which is interconnected with the variable resistor $R_V$, substantially removes the 60 Hz frequency from the output 214 thereof. In turn, the A/D 206, which is interconnected with the output 214, senses the voltage of the output 214 which corresponds to the voltage $V_V$ with the 60 Hz frequency.

Because of the relatively low impedance of the exemplary runner seal 208, various relatively low impedance shunt impedance combinations ($Z_V(i)$) of the variable resistor $R_V$ permit the determination that the upper bearing insulator impedance $Z_{UBI}$ exceeds some value, although with less precision than discussed above for the case of the RCP motor 2 having a relatively high upper bearing assembly impedance $Z_{UB}$. In a similar manner as discussed above in connection with FIGS. 8-9, if the upper bearing assembly impedance $Z_{UB}$ is assumed to be a known constant, then the value of the upper bearing insulator impedance $Z_{UBI}$ is approximated from Equation 14.

$$Z_{UBI} = \frac{Z_{TE} \times K}{K - Z_{TE}} \qquad \text{Eq. (14)}$$

where:

K=assumed value of the impedance $Z_{UB}$.

Figure 3:
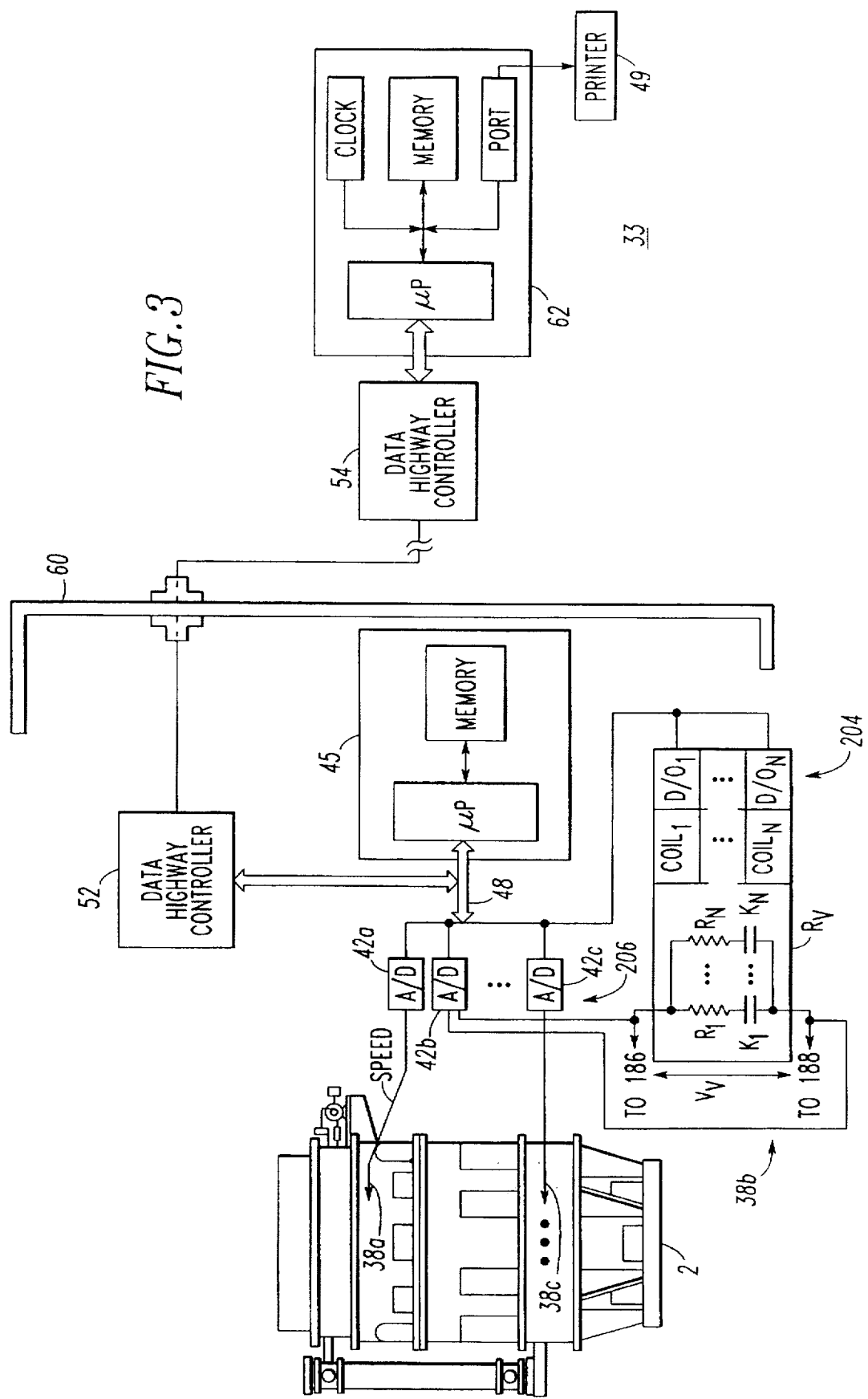
FIG. 3 is a block diagram of a motor and a remote system for diagnosing the motor in accordance with an alternative embodiment of the invention.

The insertion of the various shunt impedance combinations ($Z_V(i)$) and the determination of corresponding voltages may be done locally with respect to the RCP motors 2 and 2' (as shown in respective FIGS. 2 and 6). Furthermore, the processor 202, such as a personal computer (PC), may be part of local 32 or remote 33 diagnostic systems disclosed in incorporated by reference U.S. Pat. No. 5,485,491. For example, as shown in FIG. 3, the remote diagnostic system 33 includes local 45 and remote 62 processors which are interconnected through a barrier 60 (e.g., a biological barrier, a containment vessel, etc.) by data highway controllers 52,54 which provide a preselected periodic mapping of data specified by the remote diagnostic system 33 to and from the processor 45. The processor 45 includes a plurality of sensors 38a–38c and A/D converters 42a–42c. The A/D converter 42a monitors the speed of the motor 2 from the exemplary sensor 38a which produces an electrical signal, such as a voltage or current, proportional to such speed. During operation of the motor 2, the motor speed is determined primarily by the frequency of the voltage source $V_{ST}$ of FIG. 2. The A/D converter 42b monitors the voltage $V_V$ of the variable resistor $R_V$.

The exemplary variable resistor $R_V$ includes a plurality of resistors $R_1,R_N$, and a plurality of relay contacts $K_1,K_N$ which selectively connect the resistors $R_1,R_N$, respectively, between nodes 186 and 188. The D/O module 204 includes a plurality of D/O drivers $D/O_1,D/O_N$ and a plurality of relay coils $COIL_1,COIL_N$ which selectively open or close the contacts $K_1,K_N$ to connect the resistors $R_1,R_N$, respectively, between nodes 186,188. The processor 45 selects any of the resistors $R_1,R_N$ by energizing a corresponding one of the D/O drivers $D/O_1,D/O_N$ through the input/output (I/O) bus 48. In this manner, a particular impedance ($Z_V(i)$) is selected from an appropriate parallel combination of none, one or all of the resistors $R_1,R_N$. Preferably the resistors $R_1,R_N$; relay contacts $K_1,K_N$; and relay coils $COIL_1,COIL_N$ are local with respect to the nodes 186,188 and remote with respect to the D/O drivers D/O$_1$,D/O$_N$, although the invention is applicable to any location of the resistors R$_1$,R$_N$.

Figure 4:
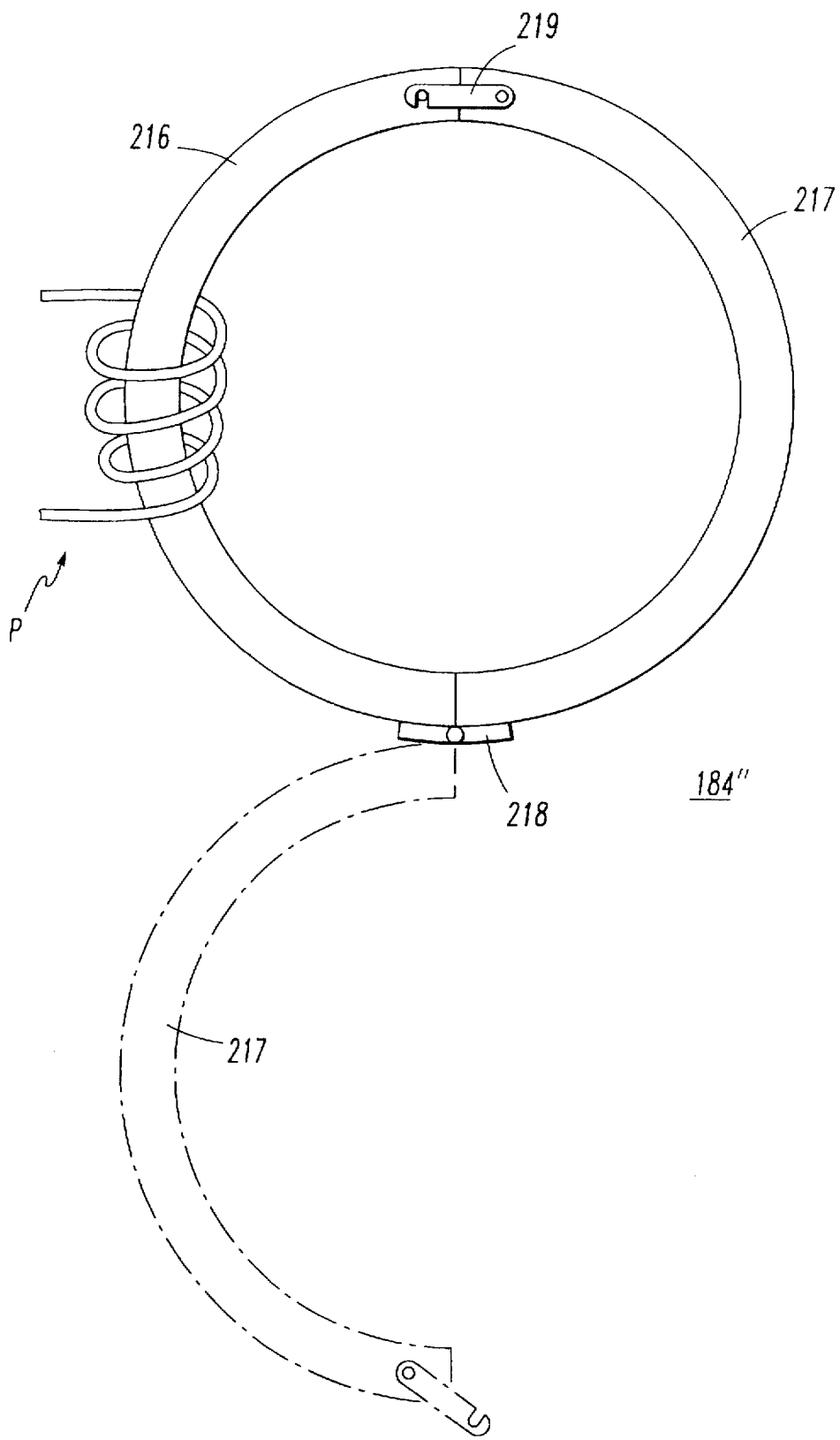
FIG. 4 is a top view of a shaft transformer in accordance with an alternative embodiment of the invention.
Figure 5:
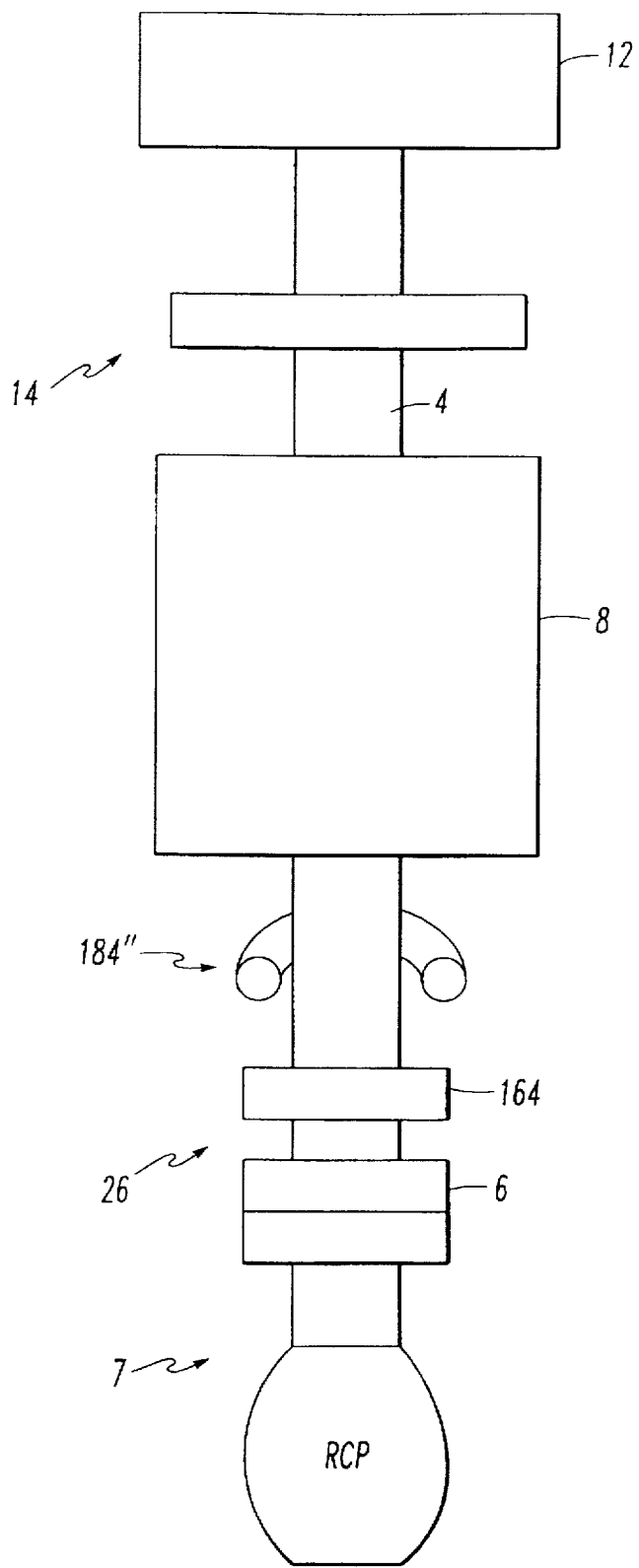
FIG. 5 is a block diagram of a motor and the shaft transformer of FIG. 4.

The exemplary shaft transformer 184' of FIGS. 2 and 6 is typically pre-installed on the shaft 4 of the respective RCP motors 2 and 2'. Referring to FIGS. 4 and 5, a portable toroidal shaft transformer 184" is field installed around the shaft 4 at an accessible location such as at the motor coupling 6 or, preferably, just above the lower bearing 164 in order that the lower bearing impedance Z$_{LB}$ may be lumped with the pump impedance Z$_P$ in a manner similar to that discussed above in connection with FIGS. 2 and 8.

The portable shaft transformer 184" has two split halves 216,217 for field installation around the shaft 4. The halves 216,217 are pivotally connected by a hinge member 218 and are connected in the closed position (shown in solid) by a latch member 219. When the half 217 is pivotally opened to the open position (shown in phantom line drawing), the other half 216 is inserted around the shaft 4 before the half 217 is connected thereto by the latch member 219. As shown in FIG. 5, the RCP 7 is engaged by the rotatable shaft 4 at the coupling 6.

Figure 11:
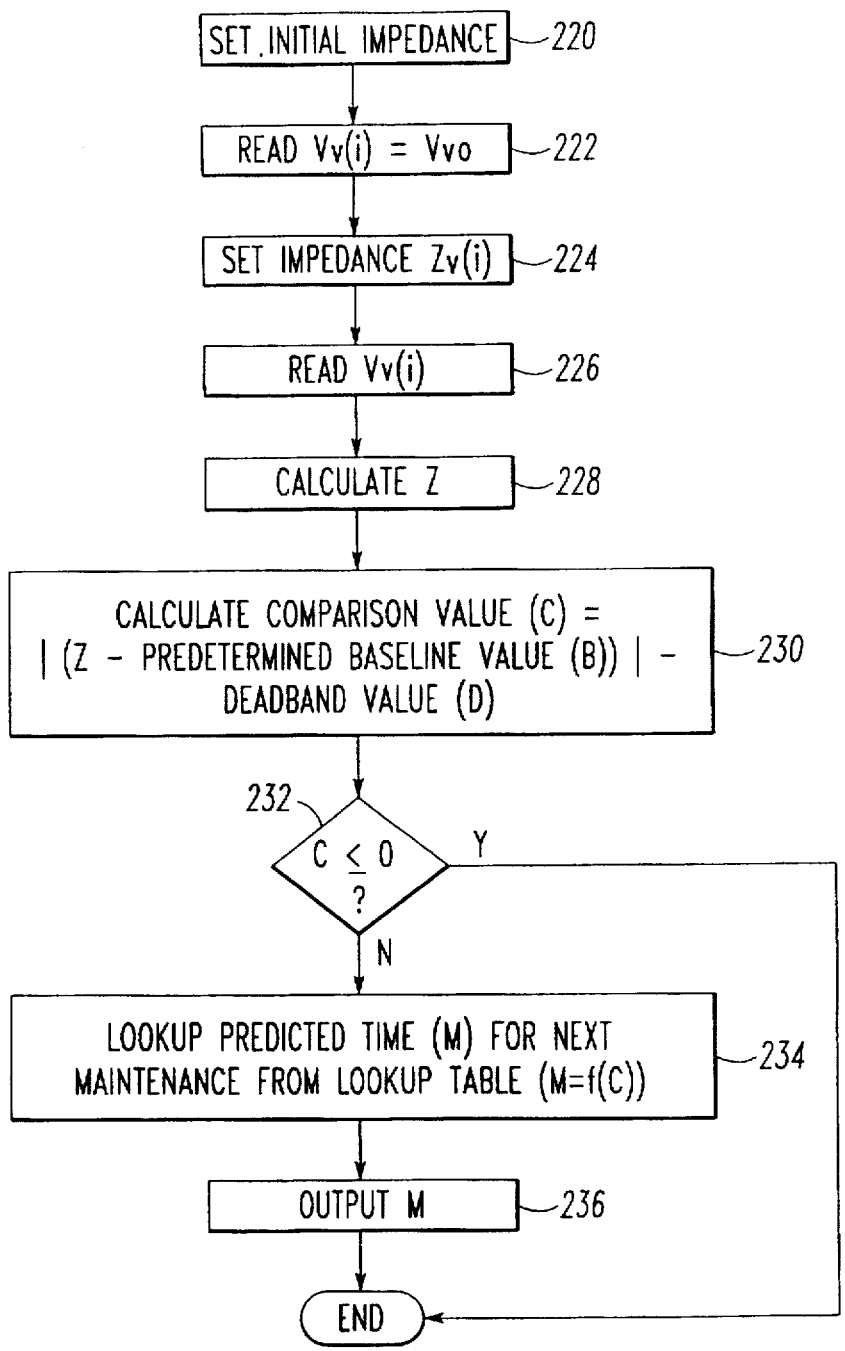
FIGS. 11–12 are flowcharts of software routines executed by a processor, in order to perform motor data collection and diagnosis.
Figure 12:
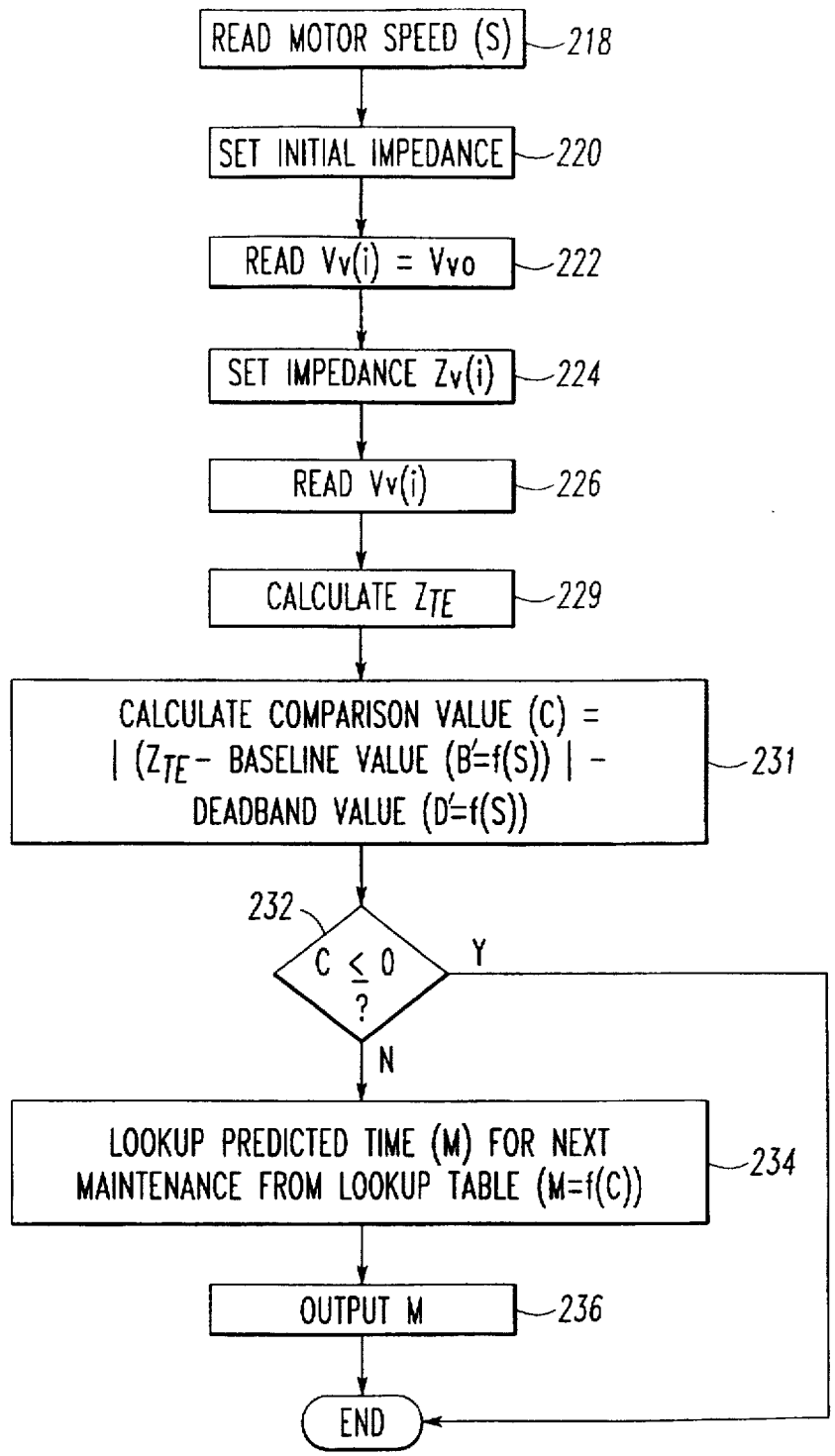

FIGS. 11-12 are flowcharts of software routines executed by the processor 202 of FIG. 2 to perform motor data collection and diagnosis. At step 220 of FIG. 11, an initial impedance (e.g., open circuit) of the variable resistor R$_V$ is set by an appropriate combination of outputs to the D/O drivers D/O$_1$,D/O$_N$ (e.g., to open the contacts K$_1$,K$_N$) (shown in FIG. 3). Then, at step 222, the voltage V$_{VO}$ is read from the A/D converter 206. Next, at step 224, another impedance (e.g., R$_1$) of the variable resistor R$_V$ is set by an appropriate combination of outputs to the D/O drivers D/O$_1$,D/O$_N$ (e.g., to close the contact K$_1$) and, at step 226, the voltage V$_V$(i) is read from the A/D converter 206. Then, at step 228, the impedance Z (e.g., the upper bearing insulator impedance Z$_{UBI}$) is calculated (e.g., employing Equations 6 and 8).

Steps 230-236 correspond to steps 260-266 disclosed in incorporated by reference U.S. Pat. No. 5,485,491. At step 230, a comparison value (C) is determined as a function of three variables: the impedance Z of step 228, a predetermined baseline value (B), and a predetermined deadband value (D) which may be any value (e.g., positive, zero or negative). The exemplary predetermined values B,D are determined from baseline or calibration values for a particular impedance of the RCP motor 2 (e.g., the upper bearing insulator impedance Z$_{UBI}$). In this manner, the impedance Z, associated with the operability of the RCP motor 2, is compared with the predetermined baseline value B and the corresponding comparison value C is produced. At step 232, if C is less than or equal to zero, which indicates that the impedance Z is within an acceptable predetermined range for a new or newly refurbished insulator, the routine exits. Otherwise, if C is positive, at step 234, a predicted time (M) of operability of the insulator is determined from the comparison value C. This may, for example, indicate when motor maintenance or inspection is required or, alternatively, that motor maintenance or inspection is required during the next scheduled outage. Finally, at step 236, a report is output to an output device (such as a printer 49 shown in FIG. 3). The report includes an identification of the impedance Z and the predicted time M. Alternatively, the report indicates that motor maintenance or inspection is required during the next scheduled outage. In this manner, voltages V$_V$(i) associated with corresponding impedances Z$_V$(i) are sensed and the operability of the insulator is determined from the values determined in steps 222-226.

FIG. 11 is also applicable to other impedances of the RCP motor 2 (e.g., a Thévenin impedance Z$_{TE}$ or a Norton impedance). For example, a decrease in the impedance Z$_{TE}$ (e.g., Equation 6) below a predetermined baseline value associated therewith may indicate a degradation of the combination of the insulators 166 and 195 associated with the lower and upper bearing assemblies 26 and 14, respectively.

FIG. 12 is similar to FIG. 11 except that step 218 is added, and steps 229 and 231 replace steps 228 and 230, respectively. At step 218, the speed of the RCP motor 2 determined by the sensor 209 is read from the A/D converter 206. Then, steps 220-226 are executed. Next, at step 229, the Thévenin impedance Z$_{TE}$ is calculated (e.g., employing Equation 11). At step 231, a comparison value (C) is determined as a function of three variables: Z$_{TE}$ of step 229, a baseline value (B'=f(S)), and a deadband value (D'=f(S)) which may be any value (e.g., positive, zero or negative). The baseline value B' and the deadband value D' are determined from a look up table based on the value of the motor speed. Then, steps 232-236 are executed.

FIG. 12 is useful, for example, where a measure (e.g., the Thévenin impedance Z$_{TE}$; the upper bearing assembly impedance Z$_{UB}$ determined from Equation 12; or the relative change in oil film thickness, which corresponds to the change in the upper bearing assembly impedance Z$_{UB}$ determined from Equation 13) of the impedance of the oil film at the bearings 114,118,120 along with the corresponding speed of the motor 2 may be compared to previously recorded data to make judgments about the consistency of the mechanical condition of the bearings 114,118,120. Alternatively, the Thévenin equivalent impedance Z$_{TE}$, which is a function of the value of the upper bearing assembly impedance Z$_{UB}$ and the upper bearing insulator impedance Z$_{UBI}$, may be utilized.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A system for diagnosing operability of a rotating electrical apparatus including a rotatable shaft having a voltage, a stator, bearing means and an insulator, with the bearing means electrically contacting the rotatable shaft and the insulator at least partially electrically insulating the rotatable shaft and the bearing means from the stator, said system comprising:

means for inducing an electrical signal, which is different than said voltage of said rotatable shaft, in said rotatable shaft;

variable impedance means in parallel with said insulator, said variable impedance means having a first impedance and a second impedance;

means for sensing a first electrical parameter associated with said first impedance and a second electrical parameter associated with said second impedance; and means for determining the operability of said insulator from the first and second electrical parameters and the second impedance.

2. The system as recited in claim 1 wherein said means for inducing the electrical signal in said rotatable shaft includes a transformer around said rotatable shaft.

3. The system as recited in claim 2 wherein said means for inducing the electrical signal in said rotatable shaft further includes a power source; and wherein the transformer has a primary winding driven by the power source and a secondary winding which includes said rotatable shaft.

4. The system as recited in claim 3 wherein the secondary winding further includes said bearing means and said insulator.

5. The system as recited in claim 3 wherein the power source is a first power source having a first frequency; wherein said stator includes stator windings and a second voltage energizing the stator windings with a second frequency; and wherein the first power source energizes the primary winding of the transformer with the first frequency.

6. The system as recited in claim 5 wherein the first frequency is about equal to the second frequency.

7. The system as recited in claim 5 wherein the first frequency is greater than the second frequency.

8. The system as recited in claim 7 wherein said means for sensing includes filter means for substantially removing the second frequency.

9. The system as recited in claim 7 wherein said variable impedance means is a variable resistor having a voltage with the first and second frequencies thereacross; and wherein said means for sensing includes:

bandpass filter means interconnected with the variable resistor, the bandpass filter means having an output with a voltage with the second frequency substantially removed therefrom; and sensing means interconnected with the output of the bandpass filter means for sensing the voltage thereof.

10. The system as recited in claim 1 wherein said rotating electrical apparatus includes a motor, a housing and a device engaged by said rotatable shaft, the housing partially enclosing said rotatable shaft which extends from the housing to the device; and wherein said means for inducing the electrical signal in said rotatable shaft is toroidal transformer including:

a first portion;

a second portion pivotally connected to the first portion; and means for connecting the first and second portions around said rotatable shaft between said housing and said device.

11. A system for diagnosing operability of a rotating electrical apparatus including a rotatable shaft having a voltage, a stator, first bearing means, second bearing means, a first insulator and a second insulator, with the first and second bearing means electrically contacting the rotatable shaft, and with each of the first and second insulators at least partially electrically insulating the rotatable shaft and a corresponding one of the first and second bearing means from the stator, said system comprising:

means for inducing an electrical signal, which is different than said voltage of said rotatable shaft, in said rotatable shaft;

variable impedance means in parallel with one of said insulators, said variable impedance means having a first impedance and a second impedance;

means for sensing a first electrical parameter associated with said first impedance and a second electrical parameter associated with said second impedance; and means for determining the operability of at least one of said insulators from the first and second electrical parameters and the second impedance.

12. The system as recited in claim 11 wherein said rotating electrical apparatus further includes a motor and a pump engaged by said rotatable shaft; wherein said pump includes means for substantially electrically short circuiting said second insulator and said second bearing means; and wherein said means for determining determines the operability of said first insulator from the first and second electrical parameters and the second impedance.

13. The system as recited in claim 12 wherein said stator includes stator windings and a voltage energizing the stator windings; wherein said rotatable shaft is a rotating shaft; and wherein said means for determining determines the operability of said first insulator during operation of said motor.

14. The system as recited in claim 12 wherein said motor includes means for rotating said rotatable shaft; and wherein said means for determining determines the operability of said first insulator during a coast-down period of said motor about when said means for rotating said rotatable shaft does not rotate said rotatable shaft.

15. The system as recited in claim 11 wherein said first bearing means includes a bearing having an impedance between said rotatable shaft and said first insulator, with the impedance of the bearing being substantially smaller than the impedance of said first insulator; wherein said means for inducing the electrical signal in said rotatable shaft includes means inducing the voltage with a first frequency; wherein said stator includes stator windings and a second voltage energizing the stator windings with a second frequency which is different from the first frequency.

16. The system as recited in claim 15 wherein said means for determining includes means determining a Thévenin equivalent impedance of the impedance of said first and second insulators and the impedance of the bearing from the first and second electrical parameters and the second impedance.

17. The system as recited in claim 11 wherein said rotating electrical apparatus is a motor; and wherein said means for determining includes means determining the operability of said first and second insulators from the first and second electrical parameters and the second impedance.

18. A system for diagnosing operability of a rotating electrical apparatus including a rotatable shaft having a voltage, a stator, bearing means and an insulator having an impedance, with the bearing means electrically contacting the rotatable shaft and the insulator at least partially electrically insulating the rotatable shaft and the bearing means from the stator, said system comprising:

means for inducing an electrical signal, which is different than said voltage of said rotatable shaft, in said rotatable shaft;

variable impedance means in parallel with said insulator, said variable impedance means having a first impedance and a second impedance;

means for sensing a first electrical parameter associated with said first impedance and a second electrical parameter associated with said second impedance; and means for determining the impedance of said insulator from the first and second electrical parameters and the second impedance.

19. A method for diagnosing operability of a rotating electrical apparatus including a rotatable shaft having a voltage, a stator, bearing means and an insulator having an impedance, with the bearing means electrically contacting the rotatable shaft and the insulator at least partially electrically insulating the rotatable shaft and the bearing means from the stator, said method comprising the steps of:

inducing an electrical signal, which is different than said voltage of said rotatable shaft, in said rotatable shaft;

employing a first impedance in parallel with said insulator;

sensing a first electrical parameter associated with said first impedance;

employing a second impedance in parallel with said insulator;

sensing a second electrical parameter associated with said second impedance; and determining the impedance of said insulator from the first and second electrical parameters and the second impedance.

20. The method as recited in claim 19 further comprising the step of:

employing a motor as said rotating electrical apparatus.

* * * * *